United States Patent
Hwang

(10) Patent No.: US 7,911,841 B2
(45) Date of Patent: Mar. 22, 2011

(54) NON-VOLATILE MEMORY DEVICE AND METHOD FOR OPERATING THE MEMORY DEVICE

(75) Inventor: Sang-Won Hwang, Suwon-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 1147 days.

(21) Appl. No.: 11/606,290

(22) Filed: Nov. 30, 2006

(65) Prior Publication Data

US 2008/0155364 A1 Jun. 26, 2008

(30) Foreign Application Priority Data

Oct. 2, 2006 (KR) ........................ 10-2006-0097417

(51) Int. Cl.
*G01R 31/28* (2006.01)
*G11C 7/00* (2006.01)
(52) U.S. Cl. ................................... 365/185.09; 714/724
(58) Field of Classification Search .................. None
See application file for complete search history.

(56) References Cited

U.S. PATENT DOCUMENTS

| 7,233,522 | B2 * | 6/2007 | Chen et al. | 365/185.02 |
| 7,716,413 | B2 * | 5/2010 | Lasser | 711/103 |
| 2005/0201151 | A1 * | 9/2005 | Tran et al. | 365/185.03 |
| 2008/0049531 | A1 * | 2/2008 | Kund | 365/222 |

FOREIGN PATENT DOCUMENTS

| JP | 2003-085549 | 3/2003 |
| KR | 100172366 B1 | 10/1998 |
| KR | 1020020081925 A | 10/2002 |

* cited by examiner

*Primary Examiner* — Hoai V Ho
*Assistant Examiner* — James G Norman
(74) *Attorney, Agent, or Firm* — Harness, Dickey & Pierce, P.L.C.

(57) ABSTRACT

A non-volatile memory may include a flag cell array, wherein each flag cell is arranged in the memory cell array interspersed among the plurality of memory cells. The flag cell array may include a plurality of flag cells indicating whether a corresponding row is MSB programmed. The non-volatile memory device performs an algorithm to read out data stored in the memory cell based on whether the memory cells of a row are MSB programmed. When determining whether the corresponding row is MSB programmed, a flag cell that is not normally operated may be replaced by a redundancy flag cell or data of the flag cell that is not normally operated may be excluded. Thus, the reliability in reading out of data and the production yield of the non-volatile memory may be improved.

8 Claims, 10 Drawing Sheets

NON-VOLATILE MEMORY DEVICE AND METHOD FOR OPERATING THE MEMORY DEVICE

PRIORITY STATEMENT

This application claims the benefit of Korean Patent Application No. 10-2006-0097417, filed on Oct. 2, 2006, in the Korean Intellectual Property Office, the disclosure of which is incorporated herein in its entirety by reference.

BACKGROUND

1. Field

Example embodiments relate to a non-volatile memory device with interspersed or separately arranged flag cells in multi-level memory cells and a method for operating the memory device.

2. Description of the Related Art

Related art non-volatile memory devices may include a NAND flash memory and a NOR flash memory. NOR flash memory may exhibit faster characteristic access time because each of its memory cells is independently connected to a bit line and a word line. The NAND flash memory may possess superior integration because of its string structure, in which a plurality of memory cells are serially connected. NAND flash memory may be used for a high capacity flash memory in digital cameras or PC cards, instead of hard disks.

FIG. 1 is a block diagram showing the arrangement of a cell array of a related art non-volatile memory. In FIG. 1, a non-volatile memory 100 may include a memory cell array 110, a flag cell array 120, a row decoder 130, and/or a page buffer 140. The memory cell array 110 may include a plurality of multi-level memory cells capable of storing data in multi-bit form.

The flag cell array 120 may include a plurality of flag cells 121 through 124, each of which may indicate whether its corresponding memory cells are MSB (most significant bit) programmed. The memory cells and the flag cells may be arranged in a matrix including a plurality of rows and columns.

FIG. 2 is a circuit diagram of the cells of the related art non-volatile memory 100 arranged in a plurality of rows and columns. The related art non-volatile memory 100 shown in FIG. 2 is a NAND flash memory. As shown in FIG. 2, the cells of the respective rows of the related art non-volatile memory 100 may be connected to the same word lines WL0-WLm, while the cells of the respective columns may be connected to the same bit lines BL0-BLn.

The row decoder 130 may be connected to a string selection line (SSL), a plurality of word lines WL0-WLm, and a ground selection line (GSL). The row decoder 130 may select a word line based on a combination of a memory block at a given address and a word line from a selected string. The page buffer 140 may be connected to a plurality of bit lines BL0-BLn and may buffer data to be input to or output from a selected row.

In FIG. 1, the flag cell array 120 of the related art non-volatile memory 100 may be densely arranged entirely to one side of the memory cell array 110. If any cell in a flag cell array is damaged and/or has a defect (for example, a large particle falls on a cell) all flag cells may not operate normally. In this case, increased errors may occur while data is read out of the memory cells, depending on whether the MSB program is performed. It is a further problem that, during this event, no cells of the non-volatile memory may be used.

SUMMARY

Example embodiments provide a non-volatile memory device which may improve reliability and/or production yield during data reading operations by arranging the flag cells based on whether the memory cells in a row corresponding to the flag cells are MSB programmed. Example embodiments also provide a method for operating these devices.

In example embodiments, a non-volatile memory device may include a memory cell array having memory cells arranged in rows and columns and a flag cell array, wherein each flag cell is arranged in the memory cell array interspersed among the plurality of memory cells.

Cells of the respective rows may be connected to the same word line as the remainder of the row while cells of the respective columns may be connected to the same bit line as the remainder of the column, and each of the flag cells may indicate whether the memory cells of one of the rows corresponding to the flag cells are MSB programmed.

Example embodiments may include a page buffer which buffers data input to or output from selected rows. Example embodiments further may include a determination circuit which may determine whether the selected row is MSB programmed based on the data of the selected row's flag cells that is output from the page buffer.

In example embodiments, the determination circuit may exclude data of a flag cell that is not normally operated during the operation of the determination circuit.

A flag cell array may include redundancy flag cells, and a flag cell that is normally operated may be replaced by one of these redundancy flag cells.

In an example embodiment, a method for operating the above example embodiments may include selecting one of the rows and reading out data from the flag cells corresponding to the selected row and determining whether the selected row is MSB programmed based on the data read from the flag cells. Determining whether the selected row is MSB programmed may include generating a plurality of selection signals based on whether a plurality of flag cells corresponding to the selected row are normally operated and determining whether the selected row is MSB programmed based on the selection signals and the data read from the flag cells.

BRIEF DESCRIPTION OF THE DRAWINGS

Example embodiments will become more apparent by describing them in detail with reference to the attached drawings in which.

DETAILED DESCRIPTION

Figure 1:
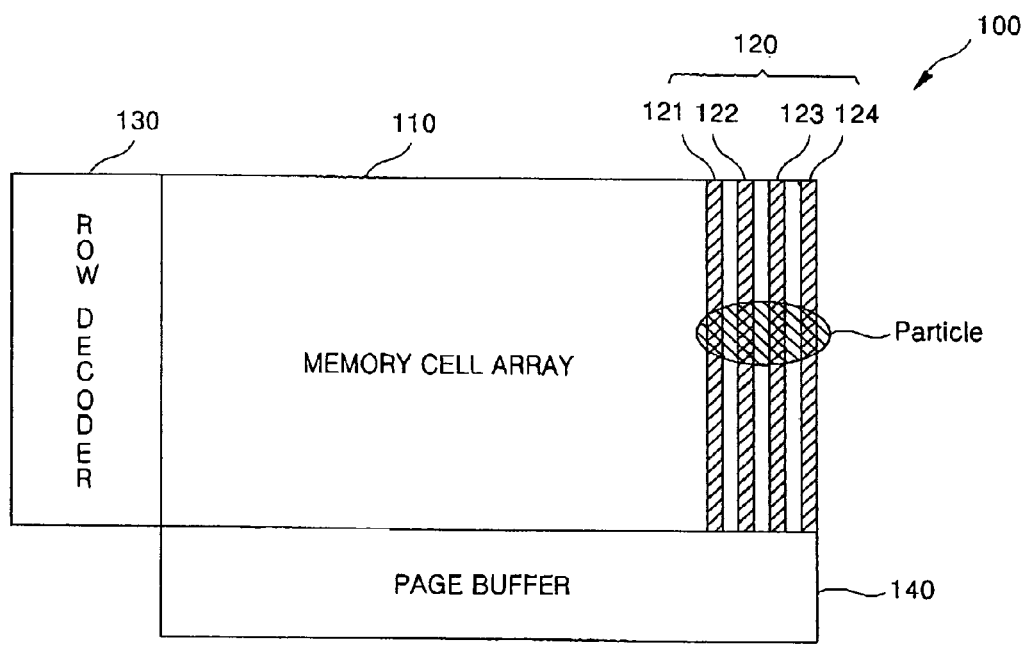
FIG. 1 is a block diagram showing the arrangement of cell arrays of a related art non-volatile memory.
Figure 2:
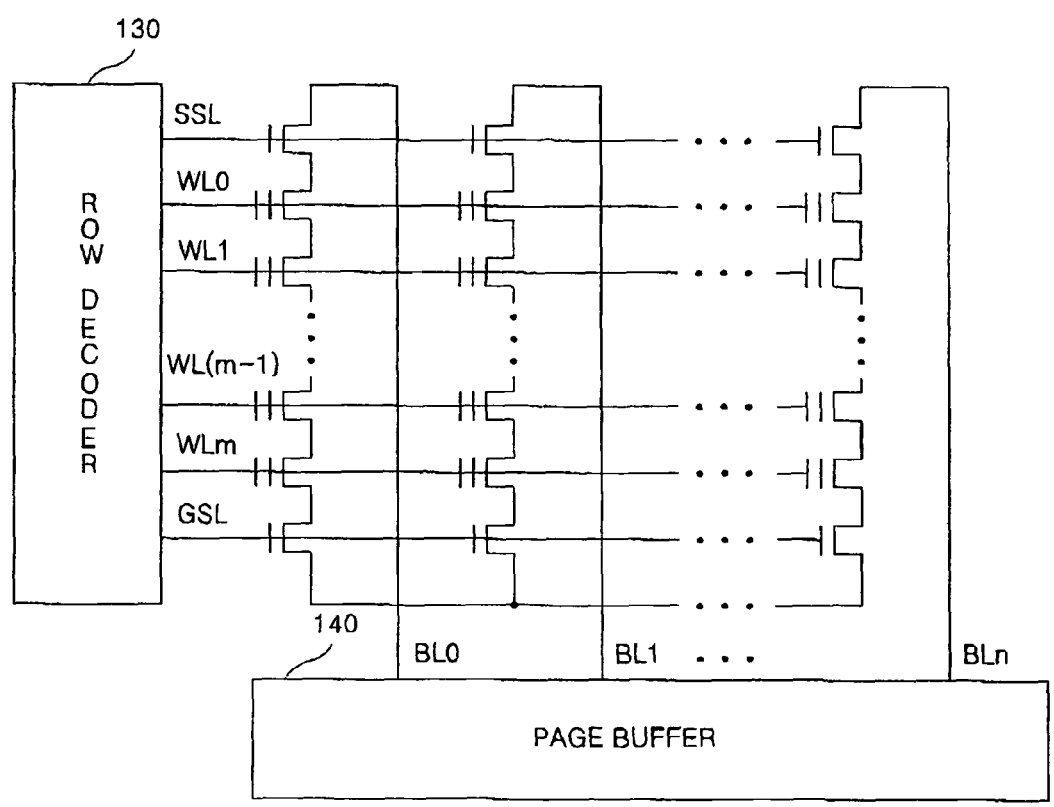
FIG. 2 is a circuit diagram of the cells of the related art non-volatile memory arranged in a plurality of rows and columns.

Various example embodiments will now be described more fully with reference to the accompanying drawings in which some example embodiments are shown. In the drawings, the thicknesses of layers and regions are exaggerated for clarity.

Detailed example embodiments are disclosed herein. However, specific structural and functional details disclosed herein are merely representative for purposes of describing example embodiments. The claims may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 3:
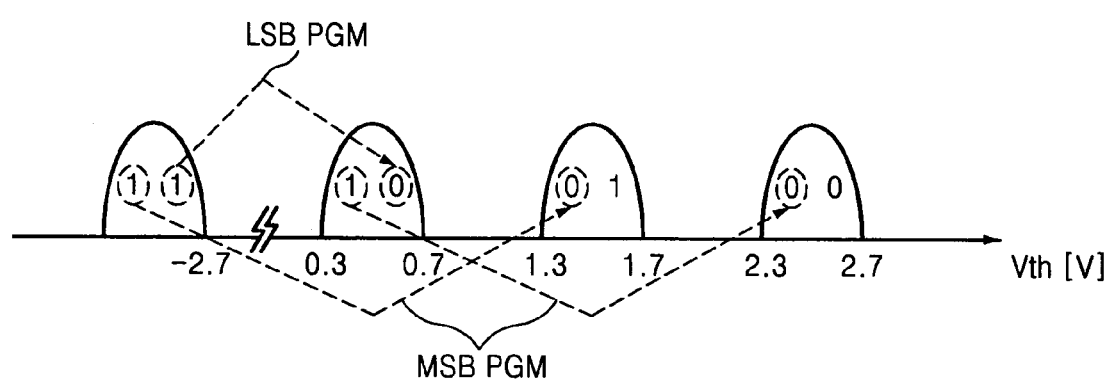
FIG. 3 is an example diagram showing the process of programming of a multi-level cell of the example embodiments.

FIG. 3 is a diagram showing the process of programming a multi-level cell according to an example embodiment. To program a selected cell, a predetermined or desired program voltage, for example, 14V-19V, may be applied to a gate of the selected cell and a channel of the selected cell is grounded. A high electric field may be formed between a floating gate and channel of the selected cell and electrons of the channel may pass through an oxide film between the floating gate and the channel and may accumulate in the floating gate. The threshold voltage of the selected cell may increase due to electrons accumulated in the floating gate, and data may be stored based on the increased threshold voltage's distribution.

In FIG. 3, the data before performing the program operation may be "1-1." The program operation may include an LSB (least significant bit) program operation and/or an MSB program operation. The "1-1" may be changed to "1-0" by the LSB program operation that changes the LSB. The MSB program operation may change the MSB based on the result of the LSB program.

If the MSB program operation is performed in combination with the LSB program operation, at the "1-0", the "1-0" may be changed to "0-0". When the MSB program operation is performed alone, at the "1-1", the "1-1" may be changed to "0-1".

Figure 4:
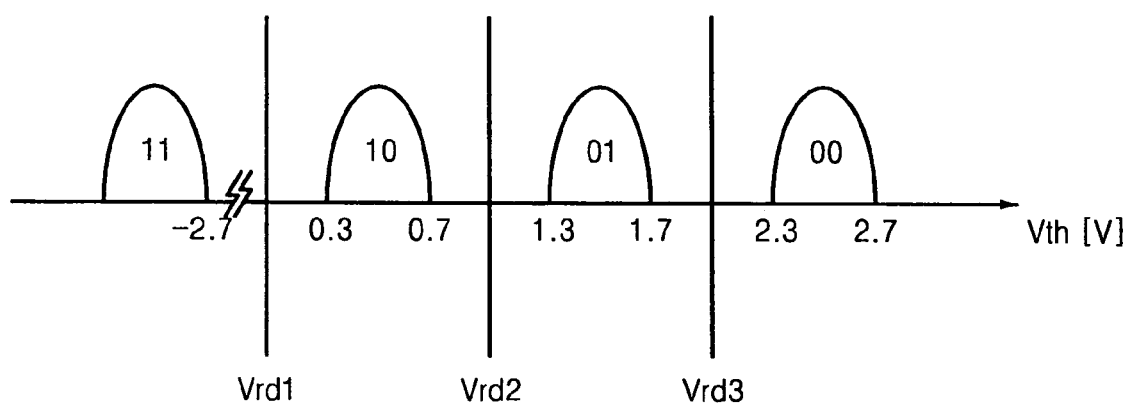
FIG. 4 is a diagram showing a data storage state according to a threshold voltage of a multi-level cell of a non-volatile memory device and a voltage applied to a gate of the multi-level cell during the data reading operation of example embodiments.

FIG. 4 shows a data storage state of an example embodiment corresponding to a threshold voltage of a multi-level cell of a non-volatile memory device with a voltage being applied to a gate of the multi-level cell during the data reading operation. In FIG. 4, the multi-level cell may have four threshold voltage (Vth) distributions and four corresponding data storage states, "1-1", "1-0", "0-1", and "0-0".

If the threshold voltage (Vth) distribution is not greater than −2.7V, the multi-level cell may correspond to the "1-1" state, 0.3V-0.7V to the "1-0" state, 1.3V-1.7V to the "0-1" state, and 2.3V-2.7V to the "0-0" state. Two-bit data may be stored in the multi-level cell according to the threshold voltage.

The data reading operation of the multi-level cell may be performed based on the amount of current flowing through a selected memory cell after a desired amount of bit line current and/or a stepped word line voltage are applied to the selected memory cell. This resulting data storage state may be buffered by the page buffer 140.

The data stored in the selected memory cell may be read out by sequentially applying Vrd3 (for example, 2V) to that word line between "0-0" and "0-1", Vrd2 (for example, 1V) between "0-1" and "1-0", and Vrd1 (for example, 0V) between "1-0" and "1-1". If Vrd1 is applied to the word line of the selected memory cell, the LSB status of the selected memory cell may be determined. If Vrd2 is applied, the MSB status of the selected memory cell may be determined.

If a memory cell in the selected column is MSB programmed, a flag cell corresponding to the selected column may store that data. For example, if the selected column is MSB programmed, '1' may be stored in the flag cell. Or, if the selected column is not MSB programmed, "0" may be stored in the flag cell. The non-volatile memory 100 may perform an algorithm to read out data stored in the memory cell based on whether the selected memory cell is LSB programmed or MSB programmed.

Figure 5:
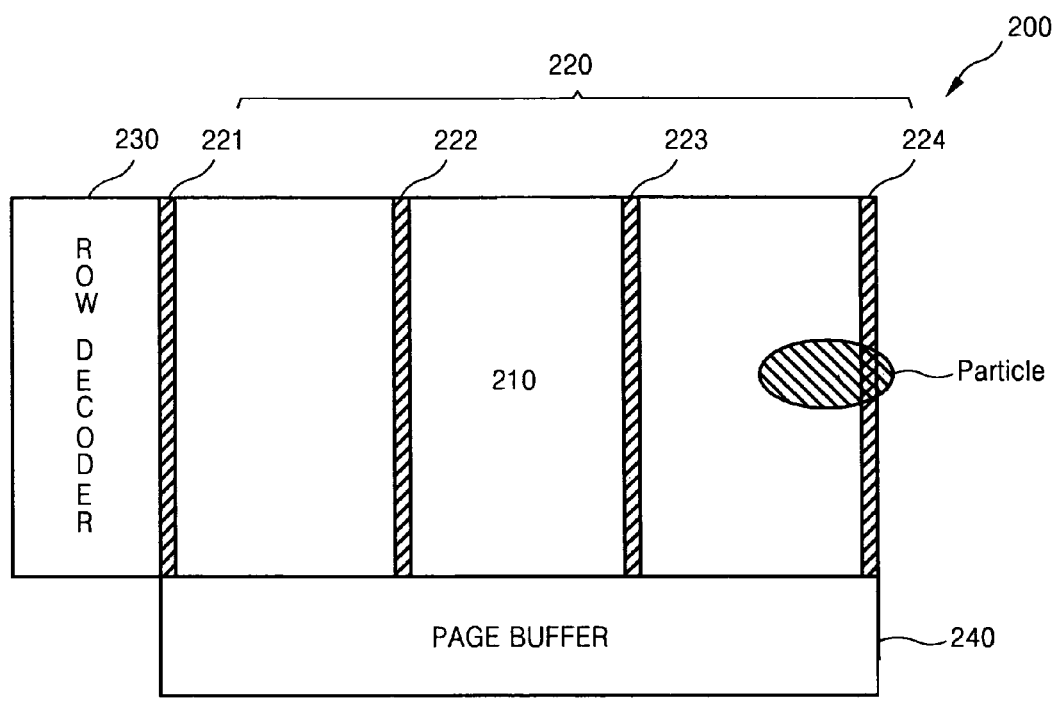
FIG. 5 is a block diagram showing the arrangement of the memory cell array and the flag cell array of example embodiments.

FIG. 5 is a block diagram showing the arrangement of the memory cell array and the flag cell array of an example embodiment. In FIG. 5, a flag cell array 220 includes a plurality of flag cells 221-224 that are interspersed or separately arranged among a memory cell array 210.

In FIG. 5, even if the flag cells 221-224 are damaged or have a defect, only one flag cell 224 may not work and the other flag cells 221-223 may work normally. By removing the data of the flag cell that is not normally operated from the process of determining MSB status or replacing the same with a redundancy cell, data reading errors and/or deteriorated production yield of memory cell may be reduced or prevented.

Figure 6:
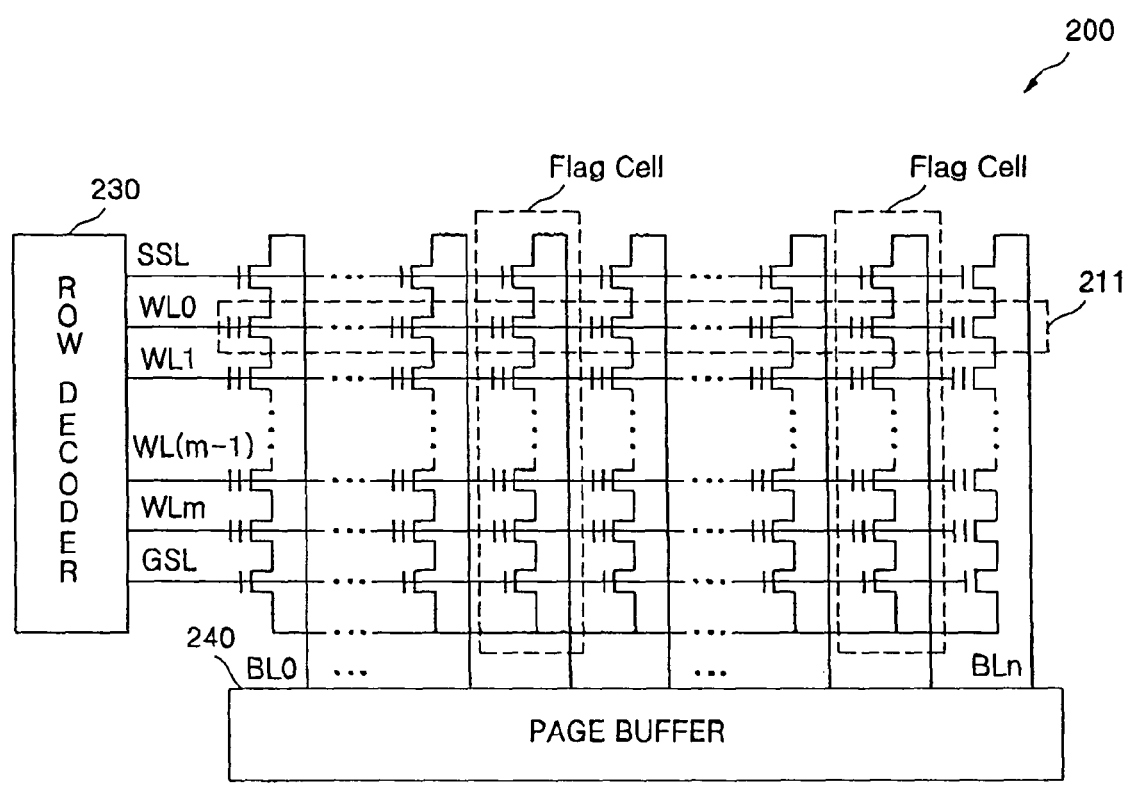
FIG. 6 is a circuit diagram of cells of a non-volatile memory according to an example embodiment arranged in a plurality of rows and columns.

FIG. 6 is a circuit diagram of cells of a non-volatile memory according to an example embodiment. In FIG. 6, the cells of the respective rows may be connected to the same word lines WL0-WLm in a row while the cells of the respective columns are connected to the same bit lines BL0-BLn in a column. Flag cells that correspond to rows may be arranged individually among the memory cells. The non-volatile memory 200 may be a NAND flash memory. The program operation may select a particular row 211 for determining cell status from the rows.

Figure 7:
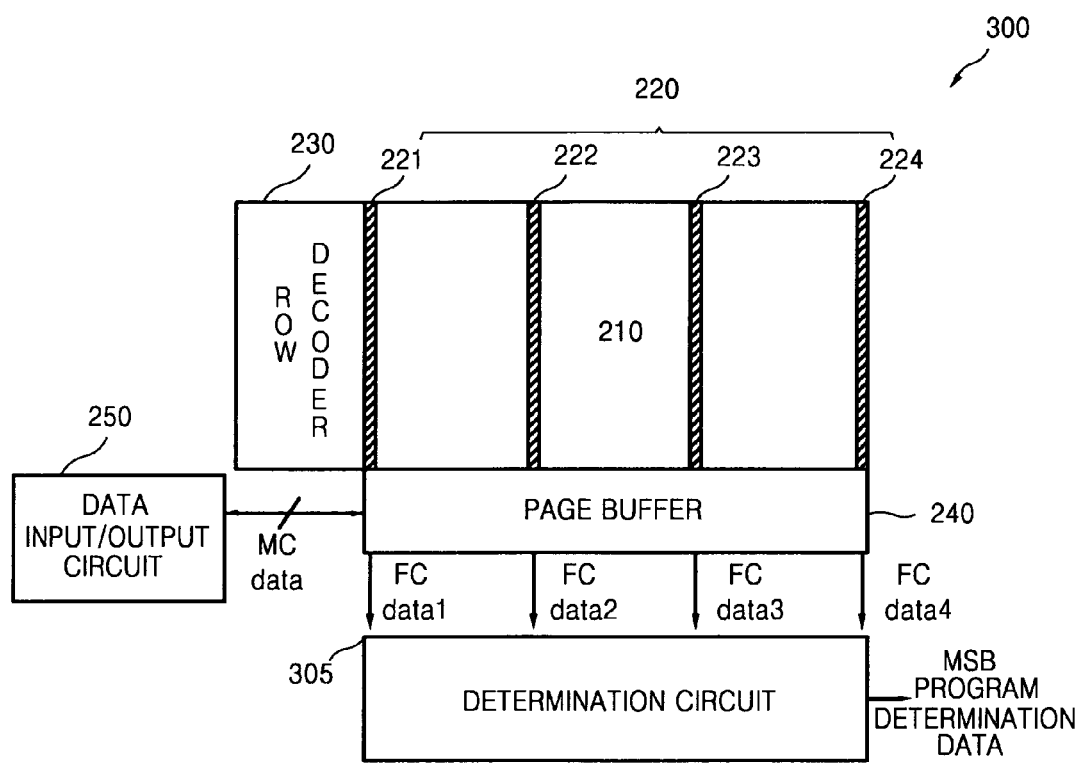
FIG. 7 is a block diagram of a non-volatile memory device with a circuit for determining whether the memory cells are MSB programmed according to an example embodiment.

FIG. 7 is a block diagram of a non-volatile memory including a circuit that may determine whether a memory cell is MSB programmed. In FIG. 7, a non-volatile memory 300 may include the memory cell array 210, the flag cell array 220, the row decoder 230, the page buffer 240, a data input/output circuit 250, and/or a determination circuit 305.

The structures and/or functions of the memory cell array 210, the flag cell array 220, the row decoder 230, and/or the page buffer 240 may be the same as those of the memory cell array 110, the flag cell array 120, the row decoder 130, and/or the page buffer 140 shown in FIG. 1. The data input/output circuit 250 may receive data about the memory cell (MC data), buffered by the page buffer 240. The data input/output circuit 250 may output the data (MC data) to the page buffer 240. The determination circuit 305 may determine whether the selected row is MSB programmed based on FC data1-FC data4 of the flag cells output from the page buffer 240.

Figure 8:
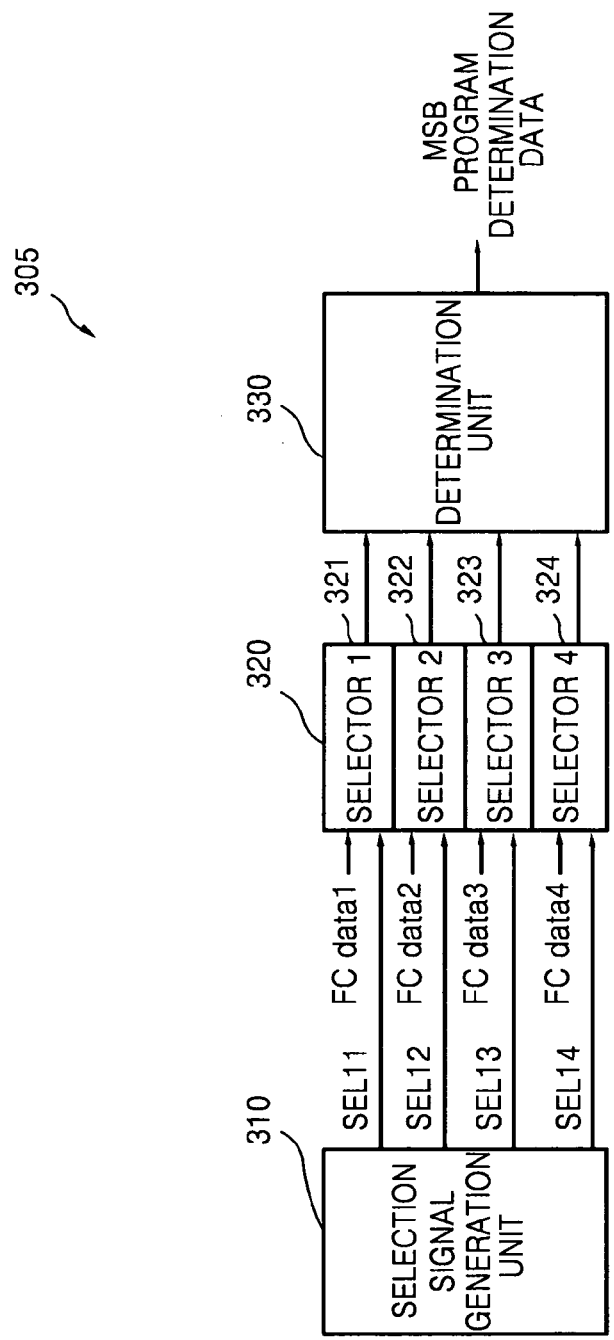
FIG. 8 is a block diagram of an example embodiment of the determination circuit of FIG. 7.

FIG. 8 is a block diagram of an example embodiment of the determination circuit 305 of FIG. 7. The determination circuit 305 may exclude data of a flag cell that is not normally operated among the flag cells 221-224 from the determination process.

In FIG. 8, the determination circuit 305 may include a selection signal generation unit 310, a selection circuit 320, and/or a determination unit 330. The selection signal generation unit 310 may generate a plurality of first selection signals SEL11 through SEL14 based on whether the respective flag cells 221-224 are normally operated. For example, if the flag cell 224 is not normally operated, the value of the first selection signal SEL14 corresponding to the flag cell 224 may be "1". If the flag cell 224 is normally operated, the value of the first selection signal SEL14 may be "0".

The selection signal generation unit 310 may include a plurality of circuits that are selectively opened (for example, by electric or laser cutting, or any other opening method) based on whether the respective flag cells 221-224 are normally operated. Each of the first selection signals may have a different value, for example, a logic value of "1" or "0", based on whether each of the circuits is opened. If the flag cell is not normally operated, the selection signal generation unit 310 may open a circuit corresponding to the flag cell and may output "1". If the flag cell is normally operated, the selection signal generation unit 310 may not open a circuit corresponding to the flag cell and may output "0".

The selection circuit 320 may include a plurality of selectors 321-324. Each of the selectors 321-324 may receive data about a corresponding flag cell and may, in response to a corresponding first selection signal SEL11-SEL14, output the data about the corresponding flag cell. If the corresponding first selection signal is "0", for example, the corresponding flag cell may be normally operated and each of the selectors 321-324 may output the data about the corresponding flag cell. If the corresponding first selection signal is "1", for example, the corresponding flag cell may not be normally operated and each of the selectors 321-324 may output "0". The data of one of the not normally operated flag cells 221-224 may be excluded in the process of determining a row's MSB status.

The determination unit 330 may determine whether the row selected from the rows is MSB programmed based on the output signals of the selectors 321-324. For example, if at least one of the output signals of the selectors 321-324 is "1", determination unit 330 may determine that the selected row is MSB programmed. The determination unit 330 may determine that the selected row is MSB programmed when more than half of the output signals of selectors 321-324 is "1". The method of determining MSB status is not limited to the above-described method. The non-volatile memory 300 may perform an algorithm to read out the data stored in the memory cells of the selected row based on the result of the determination of the row's MSB status.

Figure 9:
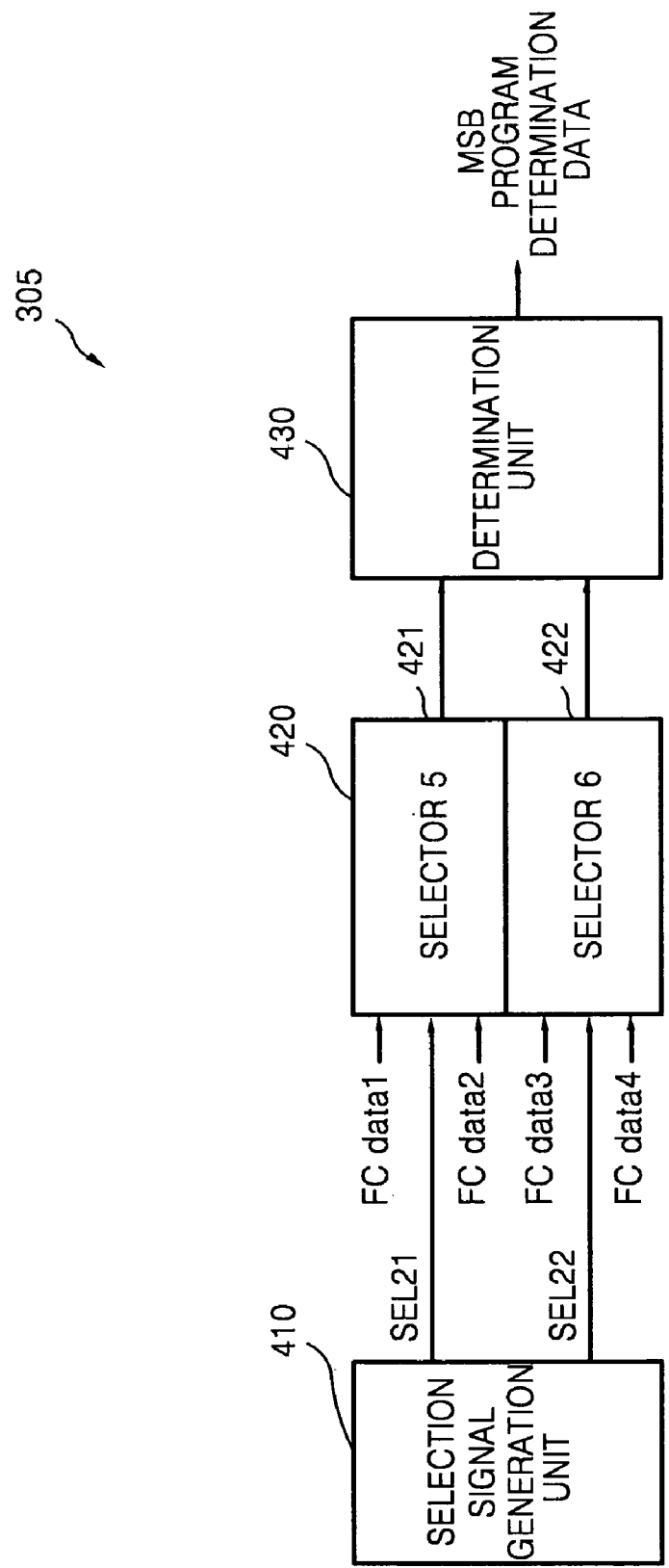
FIG. 9 is a block diagram of another example embodiment of the determination circuit of FIG. 7.

FIG. 9 is a block diagram of another example embodiment of the determination circuit 305 of FIG. 7. The determination circuit 305' may replace the flag cell that is not normally operated by a redundancy flag cell. In FIG. 7, the flag cell array 220 may be divided into flag cells 221 and 223 and corresponding redundancy flag cells 222 and 224. The determination circuit 305' may determine whether the selected row is MSB programmed based on the data about the flag cells 221-224 output from the page buffer 240.

The determination circuit 305 may include a selection signal generation unit 410, a selection circuit 420, and/or a determination unit 430. The selection signal generation unit 410 may generate a plurality of second selection signals SEL21 and SEL22 based on whether the respective flag cells 221 and 223 are normally operated. For example, if the flag cell 223 of the flag cells 221 and 223 is not normally operated, the value of the second selection signal SEL22 corresponding to the flag cell 223 may be "1". If the flag cell 223 is normally operated, the value of the second selection signal SEL22 may be "0".

The selection signal generation unit 410 may include a plurality of selectively-opened circuits based on whether the respective flag cells 221 and 223 are normally operated. In example embodiments, the plurality of selectively-opened circuits may be reversible or irreversible. For example, the circuits may be fuses cut by electric or laser cutting, switches opened and/or closed by an appropriate method, or any other suitable device. Each of the second selection signals may have a different value, for example, a logic value of "1" or "0', based on whether each of the circuits is open. If the flag cell is not normally operated, the selection signal generation unit 410 may open a circuit corresponding to the flag cell and may output "1". If the flag cell is normally operated, the selection signal generation unit 410 may not open a circuit corresponding to the flag cell and may output "0".

The selection circuit 420 may include a plurality of selectors 421 and 422. Each of the selectors 421 and 422 may receive data about a corresponding flag cell and corresponding redundancy flag cell. Each of the selectors 421 and 422 may selectively output the data about the corresponding flag cell or its redundancy flag cell in response to the second selection signal.

If the corresponding second selection signal is "0", for example, the corresponding flag cell may be normally operated, and the selection circuit 420 may output the data of the corresponding flag cell. If the corresponding second selection signal is "1", for example, the corresponding flag cell may not be normally operated, and the selection circuit 420 may output the data of the redundancy flag cell corresponding to the flag cell. The data of the flag cell that is not normally operated may be replaced by the data of the redundancy flag cell in the process of determining whether the selected row is MSB programmed.

The determination unit 430 may determine whether the selected row is MSB programmed based on the output signals of the selectors 421 and 422. If at least one of the output signals of the selectors 421 and 422 is "1", the determination unit 430 may determine that the selected row is MSB programmed. Also, the determination unit 430 may determine if the selected row is MSB programmed if more than half of the output signals of the selectors 421 and 422 are "1". The determination method of the determination unit 430 is not limited to the above-described method. The non-volatile memory 300 may perform an algorithm to read out the data stored in the selected row's memory cells based on the result of the determination of MSB status.

Figure 10:
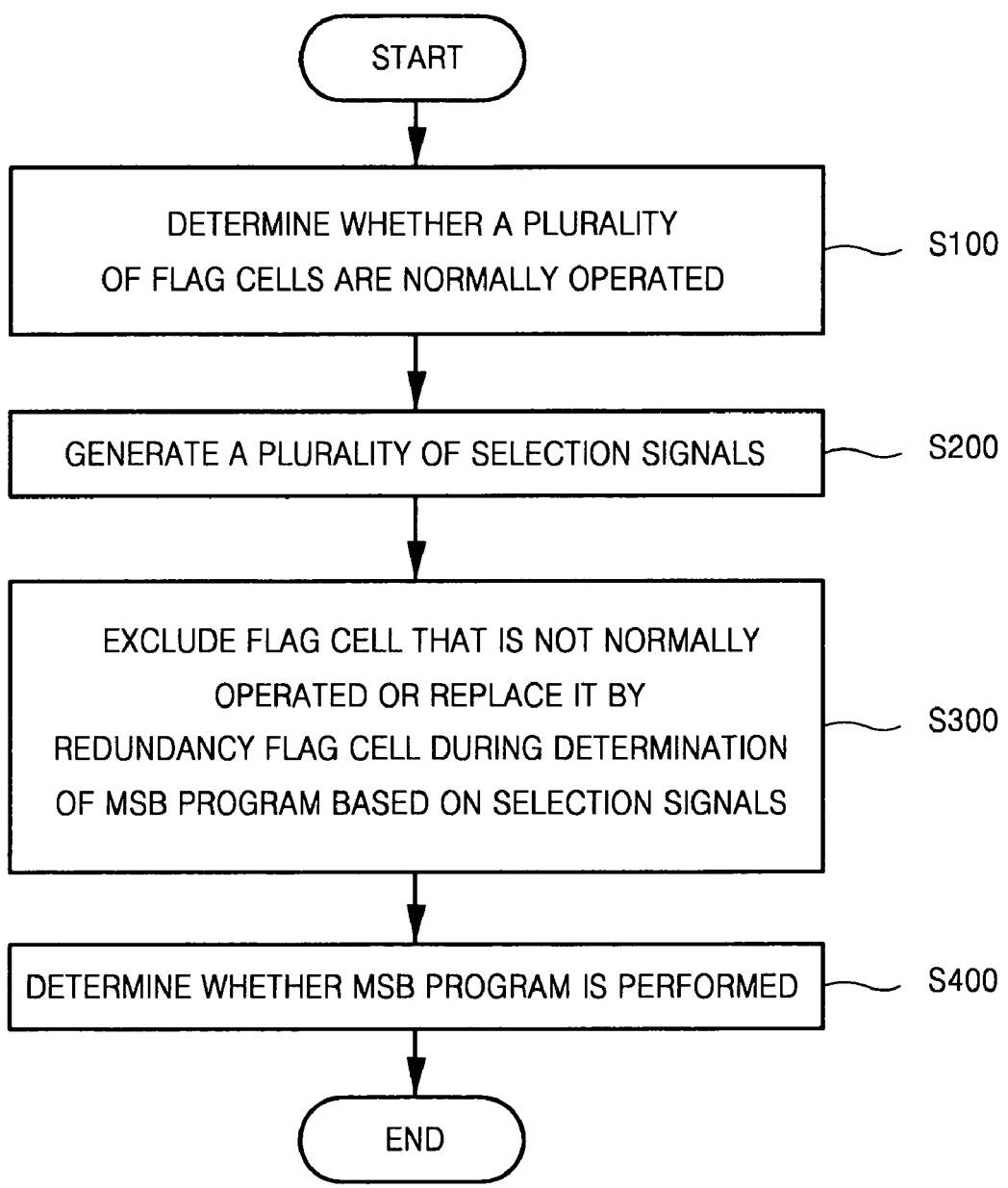
FIG. 10 is a flow chart for explaining the process of determining the performance of the MSB program with respect to the memory cells according to an example embodiment.

FIG. 10 is a flow chart illustrating an example of the process for determining whether the MSB program has been performed on the memory cells. FIGS. 5 through 9 illustrate example embodiments of this process in detail.

In FIG. 10, the non-volatile memory 200 may include a memory cell array 210 of memory cells in rows and columns and a flag cell array 220 with flag cells 221-224 in corresponding rows interspersed or separately arranged among the memory cells.

It may be determined whether each flag cell 221-224 is normally operated (S100). Selection signals may be generated based on this determination (S200). In FIG. 8, the selection signal generation unit 310 may generate the first selection signals SEL11-SEL14 reflecting whether the flag cells 221-224 are normally operated. In FIG. 9, the selection signal generation unit 410 may generate second selection signals SEL21 and SEL22 reflecting whether the flag cells 221 and 223 are normally operated.

The data of not normally operated flag cells may be excluded based on the selection signals, or the not normally operated flag cell may be replaced by the redundancy flag cell (S300). In FIG. 8, each of the selectors 321-324 of the selection circuit 320 may receive data from a corresponding flag cell and may selectively output that data in response to a corresponding first selection signal of the first selection signals SEL11-SEL14. In FIG. 9, each of the selectors 421 and 422 of the selection circuit 420 may selectively output the data of a corresponding flag cell or of a corresponding redundancy flag cell in response to a corresponding second selection signal of the second selection signals SEL21 and SEL22.

Whether the corresponding row is MSB programmed may be determined based on the data of the flag cells that is selectively output from the selection circuit (S400). Referring to FIG. 8, the determination unit 330 may determine whether the selected row is MSB programmed based on the output signals of the selectors 321-324. In FIG. 9, the determination unit 430 may determine whether the selected row is MSB programmed based on the output signals of the selectors 421 and 422. The same determination may be made from interspersing or separately arranging a different kind of flag cell in the memory cell array.

In example embodiments, the flag cells and/or redundant flag cells may be evenly interspersed on unevenly dispersed.

As described above, a non-volatile memory device having flag cell(s) (and/or redundant flag cell(s)) interspersed or separately arranged among a memory cell array according to example embodiments may reduce the generation of an error in the process of reading out the data of a memory cell based on whether the selected row is MSB programmed and/or may increase the production yield of the non-volatile memory.

What is claimed is:

1. A non-volatile memory device comprising:
   a memory cell array having a plurality of memory cells arranged in rows and columns;
   a flag cell array having a plurality of flag cells and a redundancy flag cell that may replace one of the plurality of flag cells, wherein each flag cell is arranged in the memory cell array interspersed among the plurality of memory cells, all cells of a given row being connected to a same word line and all cells of a given column being connected to a same bit line, each flag cell corresponding to one row of the rows;
   a page buffer configured to buffer data input to or output from one of the rows; and
   a circuit configured to determine a MSB status of one of the rows, the circuit including,
      a selection signal generation unit configured to output a plurality of selection signals based on whether the corresponding flag cell is normally operated,
      a selection circuit including a plurality of selectors configured to receive data of the corresponding flag cell and the redundancy flag cell and selectively output the data of the corresponding flag cell or the redundancy flag cell in response to the selection signals, and
      a determination unit configured to determine MSB status of the one row based on output signals of the plurality of selectors.

2. The memory device of claim 1, wherein the memory cells and flag cells are electrically erasable and programmable.

3. The memory device of claim 1, wherein the selection signal generation unit includes a plurality of circuits configured to be selectively opened.

4. A method for operating a memory device comprising:
   providing the memory device including a memory cell array having a plurality of memory cells arranged in rows and columns and a flag cell array having a plurality of flag cells and a redundancy flag cell that may replace one of the plurality of flag cells, wherein each flag cell is arranged in the memory cell array interspersed among the plurality of memory cells;
   selecting a row;
   determining whether the selected row is MSB programmed, the determining including,
      generating a plurality of selection signals based on whether the flag cell in the selected row is normally operated,
      selectively outputting data of the flag cell if the flag cell is normally operated or the flag cell's redundancy flag cell if the flag cell is not normally operated, based on the generated selection signal, and
      determining whether the selected row is MSB programmed based on the selection signals and the selectively output data from the flag cell or the redundancy flag cell.

5. The method of claim 4, further comprising:
opening circuits within a selection signal generation unit based on whether the respective flag cells are normally operated.

6. The method of claim 4, wherein generating a plurality of selection signals includes providing a plurality of selection signals with different values based on whether the respective circuits are open.

7. The method of claim 4, further comprising:
buffering data input to or output from a row in a page buffer.

8. The method of claim 5, wherein the opening circuits includes selectively cutting a plurality of fuses in order to open the desired circuits.

* * * * *